US012720812B2

(12) United States Patent
Yasutake et al.

(10) Patent No.: US 12,720,812 B2
(45) Date of Patent: Aug. 25, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takuya Yasutake, Kanazawa Ishikawa (JP); Yasunobu Saito, Tokyo (JP); Tsuyoshi Kachi, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 360 days.

(21) Appl. No.: 18/234,290

(22) Filed: Aug. 15, 2023

(65) Prior Publication Data

US 2024/0313045 A1 Sep. 19, 2024

(30) Foreign Application Priority Data

Mar. 15, 2023 (JP) ................................ 2023-040708

(51) Int. Cl.
*H10D 62/10* (2025.01)
*H10D 30/66* (2025.01)
(Continued)

(52) U.S. Cl.
CPC ......... *H10D 62/102* (2025.01); *H10D 30/665* (2025.01); *H10D 30/668* (2025.01);
(Continued)

(58) Field of Classification Search
CPC .. H10D 62/102; H10D 30/665; H10D 30/668; H10D 64/117; H10D 64/252;
(Continued)

(56) References Cited

U.S. PATENT DOCUMENTS 5,072,266 A 12/1991 Bulucea et al.
9,711,637 B2 7/2017 Numabe et al.
(Continued)

FOREIGN PATENT DOCUMENTS

CN 103 904 119 A 7/2014
JP 2009-043966 A 2/2009
(Continued)

OTHER PUBLICATIONS

Office Action issued in Japanese Patent Application No. 2023-040708, dated Feb. 3, 2026 in 10 pages.

*Primary Examiner* — Steven B Gauthier
*Assistant Examiner* — Khatib A Rahman
(74) *Attorney, Agent, or Firm* — Knobbe, Martens, Olson & Bear, LLP

(57) ABSTRACT

A semiconductor device includes a first electrode, a second electrode, a first semiconductor layer, a third electrode, a second semiconductor layer, a third semiconductor layer, a fourth electrode, and a fourth semiconductor layer. The third semiconductor layer extends from the second semiconductor layer toward the first electrode side. A lower end of the third semiconductor layer at the first electrode side is positioned further toward the first electrode side than the lower surface of the second semiconductor layer and is separated from the insulating body. The third semiconductor layer is of the second conductivity type. The fourth electrode faces the second semiconductor layer via an other portion of the insulating body. The fourth semiconductor layer is located between the second semiconductor layer and the second electrode and electrically connected with the second electrode. The fourth semiconductor layer is of the first conductivity type.

9 Claims, 15 Drawing Sheets

(51) Int. Cl.
*H10D 64/00* (2025.01)
*H10D 64/23* (2025.01)

(52) U.S. Cl.
CPC ......... *H10D 64/117* (2025.01); *H10D 64/252* (2025.01); *H10D 64/258* (2025.01)

(58) Field of Classification Search
CPC .... H10D 64/258; H10D 12/481; H10D 64/23; H10D 62/393; H10D 64/256; H10D 62/127
See application file for complete search history.

(56) References Cited

U.S. PATENT DOCUMENTS 10,971,621 B2 4/2021 Katou et al.
10,998,438 B2 5/2021 Yilmaz
11,107,898 B2 8/2021 Kikuchi
11,127,854 B2* 9/2021 Katou .................. H10D 64/516
2007/0045700 A1 3/2007 Ohtani et al.
2012/0175699 A1* 7/2012 Hsieh .................. H10D 30/668 257/E27.06
2012/0241854 A1 9/2012 Ohta et al.
2012/0242342 A1 9/2012 Rabinovich et al.
2012/0248462 A1* 10/2012 Wada ................ H10D 30/0297 257/77
2019/0296147 A1* 9/2019 Kawamura .......... H10D 62/111
2020/0266293 A1* 8/2020 Katou .................. H10D 62/106
2020/0295181 A1* 9/2020 Shimomura ......... H10D 30/668
2021/0057573 A1* 2/2021 Shimomura ....... H10D 84/0135
2021/0242342 A1 8/2021 Goda et al.
2022/0013639 A1 1/2022 Tanaka et al.
2022/0045208 A1 2/2022 Okuda et al.
2023/0100800 A1* 3/2023 Yilmaz ................ H10D 64/513 257/288

FOREIGN PATENT DOCUMENTS

JP 4939012 B2 3/2012
JP 2018-082202 A 5/2018
JP 2019-165065 A 9/2019
JP 2020-136461 A 8/2020
JP 2020-155529 A 9/2020
JP 6804712 B2 12/2020
JP 2022-016286 A 1/2022
JP 2022-038240 A 3/2022

* cited by examiner

SEMICONDUCTOR DEVICE

CROSS-REFERENCE TO RELATED APPLICATIONS

This application is based upon and claims the benefit of priority from Japanese Patent Application No. 2023-040708, filed on Mar. 15, 2023; the entire contents of which are incorporated herein by reference.

FIELD

Embodiments relate to a semiconductor device.

BACKGROUND

When avalanche breakdown occurs in a semiconductor device for power control, there are cases where a parasitic n-p-n bipolar transistor turns on, and secondary breakdown occurs. Breakdown of the semiconductor device may be caused thereby.

DETAILED DESCRIPTION

A semiconductor device according to an embodiment, includes a first t electrode, a second electrode, a first semiconductor layer, a third electrode, a second semiconductor layer, a third semiconductor layer, a fourth electrode, and a fourth semiconductor layer. The first semiconductor layer is located between the first electrode and the second electrode. The first semiconductor layer is of a first conductivity type. The third electrode is located in the first semiconductor layer. The third electrode faces the first semiconductor layer via a portion of an insulating body. The second semiconductor layer is located between the first semiconductor layer and the second electrode. The second semiconductor layer includes a lower surface positioned at the first electrode side. The second semiconductor layer is electrically connected with the second electrode. The second semiconductor layer is of a second conductivity type. The third semiconductor layer extends from the second semiconductor layer toward the first electrode side. A lower end of the third semiconductor layer at the first electrode side is positioned further toward the first electrode side than the lower surface of the second semiconductor layer and is separated from the insulating body. The third semiconductor layer is of the second conductivity type. The fourth electrode faces the second semiconductor layer via an other portion of the insulating body. The fourth semiconductor layer is located between the second semiconductor layer and the second electrode and electrically connected with the second electrode. The fourth semiconductor layer is of the first conductivity type.

First Embodiment

Figure 1:
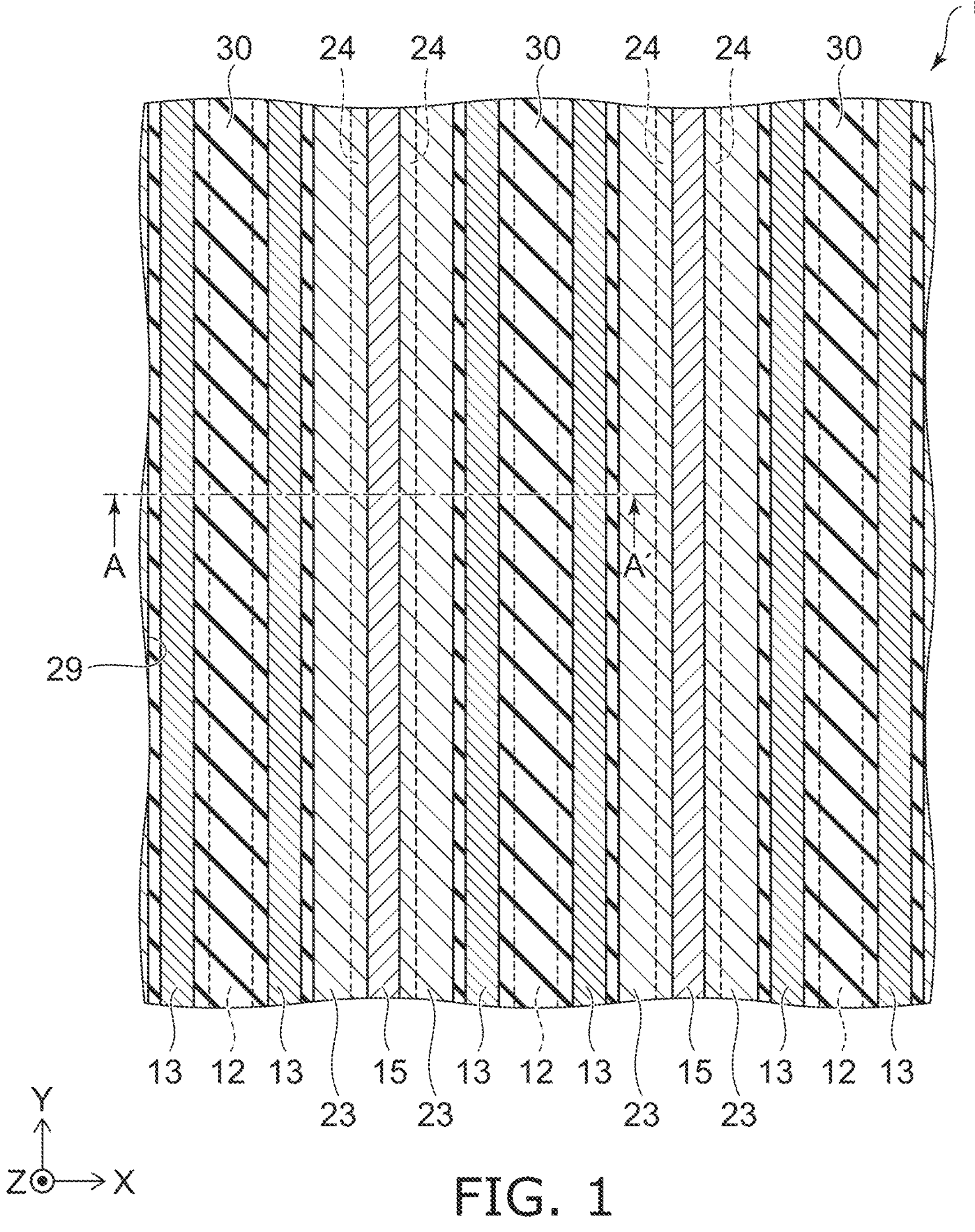
FIG. 1 is a cross-sectional view showing a semiconductor device according to a first embodiment.

FIG. 1 is a cross-sectional view showing a semiconductor device according to the embodiment.

Figure 2:
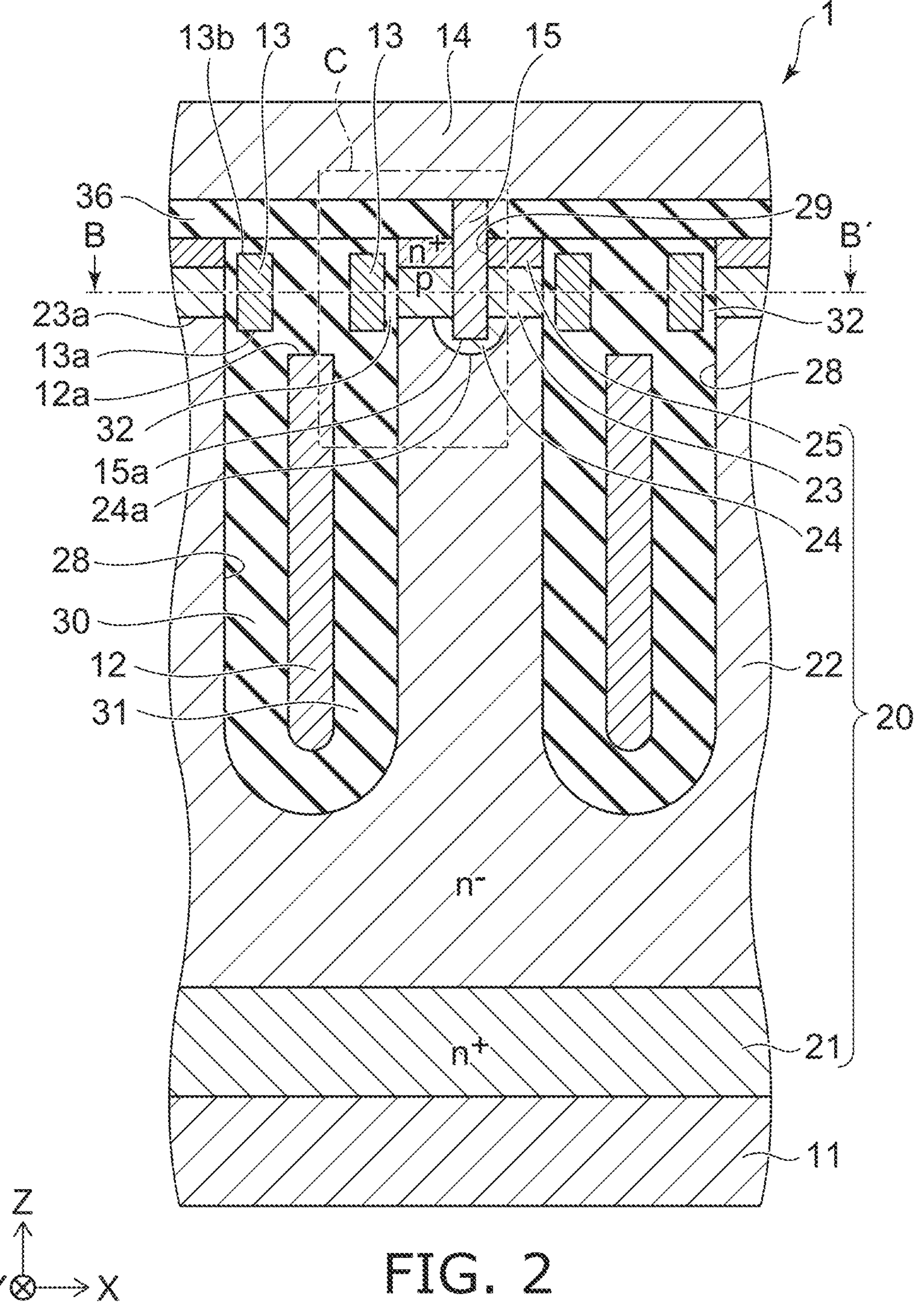
FIG. 2 is a cross-sectional view along line A-A' shown in FIG. 1.

FIG. 2 is a cross-sectional view along line A-A' shown in FIG. 1.

FIG. 1 corresponds to a cross section along line B-B' shown in FIG. 2.

The semiconductor device according to the embodiment is a vertical semiconductor device for power control and is, for example, a MOSFET (Metal-Oxide-Semiconductor Field-Effect Transistor). The semiconductor device according to the invention is not limited thereto, and may be, for example, an IGBT (Insulated Gate Bipolar Transistor). A MOSFET is described as an example in the embodiment.

As shown in FIGS. 1 and 2, the semiconductor device 1 according to the embodiment includes a drain electrode 11 (a first electrode), a semiconductor part 20, an insulating body 30, a field plate electrode 12 (a fourth electrode, called the "FP electrode 12" hereinbelow), a gate electrode 13 (a third electrode), an insulating film 36, a source electrode 14 (a second electrode), and a trench contact 15 (a fifth electrode).

An XYZ orthogonal coordinate system is employed for convenience of description in the specification hereinbelow. The direction from the drain electrode 11 toward the source electrode 14 is taken as a "Z-direction"; the direction in which the gate electrode 13 extends is taken as a "Y-direction"; and a direction orthogonal to the Z-direction and the Y-direction is taken as an "X-direction". Among the Z-directions, a direction that is from the drain electrode 11 toward the source electrode 14 also is called "up", and the opposite direction also is called "down", but these expressions are for convenience and are independent of the direction of gravity.

The drain electrode 11, the semiconductor part 20, the insulating film 36, and the source electrode 14 are stacked in this order upward from below in the semiconductor device 1. The drain electrode 11 and the source electrode 14 have plate shapes spreading along the XY plane. The insulating body 30 is located in the semiconductor part 20. The FP electrode 12 and the gate electrode 13 are located in the insulating body 30.

The semiconductor part 20 is made of a semiconductor material, includes, for example, silicon (Si), and has a conductivity type that is set to a p-type or an n-type by, for example, locally introducing an impurity to single-crystal silicon. The semiconductor part 20 includes an $n^+$-type drain layer 21, an n-type drift layer 22, a p-type first base layer 23 (a second semiconductor layer), a p-type second base layer 24 (a third semiconductor layer), and an $n^+$-type source layer 25 (a fourth semiconductor layer).

The notations of "$n^+$-type", "n-type", and "n-type" indicate the relative magnitude relationship of the carrier concentrations; the "$n^+$-type" indicates a higher carrier concentration than the "n-type"; and the "n-type" indicates a lower carrier concentration than the "n-type". The "carrier concentration" means the effective impurity concentration contributing to the conductivity of the semiconductor material, and corresponds to the net impurity concentration excluding the cancelled portion when one region includes both an impurity that forms donors and an impurity that forms acceptors.

The drain layer 21 is located on the drain electrode 11 and contacts the drain electrode 11. Accordingly, the drain layer 21 is connected to the drain electrode 11. In the specification, "connected" means an electrical connection. The drift layer 22 is located on the drain layer 21 and contacts the drain layer 21. The carrier concentration of the drift layer 22 is less than the carrier concentration of the drain layer 21. The first semiconductor layer includes the drain layer 21 and the drift layer 22.

The first base layer 23 is located on the drift layer 22. The second base layer 24 contacts a lower surface 23*a* of the first base layer 23 and extends downward from the lower surface 23*a* of the first base layer 23 inside the drift layer 22. The carrier concentration of the second base layer 24 is greater than the carrier concentration of the first base layer 23. For example, the carrier concentration of the first base layer 23 is about $1\times10^{13}$ $cm^{-3}$; and the carrier concentration of the second base layer 24 is about $1\times10^{15}$ $cm^{-3}$. The source layer 25 is located on the first 25 base layer 23 and contacts the first base layer 23.

Trenches 28 and 29 are formed in the upper surface of the semiconductor part 20 and are alternately arranged in the X-direction. The trenches 28 and 29 each extend in the Y-direction. The insulating body 30 is located in the trench 28. Accordingly, the insulating body 30 is located in the semiconductor part 20; and the upper surface of the insulating body 30 is exposed at the upper surface of the semiconductor part 20.

Multiple insulating bodies 30 are arranged along the X-direction in the semiconductor part 20. Each insulating body 30 extends in the Y-direction. The upper surface of the insulating body 30 is exposed at the upper surface of the semiconductor part 20; and the lower end of the insulating body 30 is positioned in the drift layer 22. Accordingly, the insulating body 30 does not extend through the semiconductor part 20 in the Z-direction. The insulating body 30 is separated from the drain layer 21 and contacts the drift layer 22, the first base layer 23, and the source layer 25.

One FP electrode 12 and two gate electrodes 13 are located in each insulating body 30. The FP electrode 12 and the gate electrode 13 also extend in the Y-direction. In each insulating body 30, the FP electrode 12 is located lower than the gate electrode 13; and an upper end 12*a* of the FP electrode 12 is positioned lower than a lower end 13*a* of the gate electrode 13. The FP electrode 12 is positioned between two gate electrodes 13 in the X-direction when viewed from above.

Multiple trench contacts 15 are arranged along the X-direction. Each trench contact 15 extends in the Y-direction. The upper end of each trench contact 15 contacts the source electrode 14; the upper portion of the trench contact 15 extends through the insulating film 36; and the lower portion of the trench contact 15 is located in the trench 29. A lower end 15*a* (the end portion) of the trench contact 15 is positioned in the second base layer 24, and is positioned lower than the lower surface 23*a* of the first base layer 23 and the lower end 13*a* of the gate electrode 13 and higher than the upper end 12*a* of the FP electrode 12.

The trench contact 15 contacts the insulating film 36, the source layer 25, the first base layer 23, and the second base layer 24. Accordingly, the trench contact 15 is connected to the source electrode 14, the source layer 25, the first base layer 23, and the second base layer 24. On the other hand, the trench contact 15 is separated from the drain layer 21 and the drift layer 22.

The second base layer 24 is separated from the insulating body 30 by the drift layer 22. A lower end 24*a* of the second base layer 24 is positioned lower than the lower surface 23*a* of the first base layer 23 and higher than the upper end 12*a* of the FP electrode 12. It is favorable for the lower end 24*a* of the second base layer 24 to be positioned lower than the lower end 13*a* of the gate electrode 13. The lower surface 23*a* of the first base layer 23 is positioned higher than the lower end 13*a* of the gate electrode 13. The interface between the first base layer 23 and the source layer 25 is positioned lower than an upper end 13*b* of the gate electrode 13. The upper surface of the source layer 25 is positioned higher than the upper end 13*b* of the gate electrode 13.

The FP electrode 12 therefore faces the drift layer 22 via a portion 31 of the insulating body 30. The gate electrode 13 faces the upper portion of the drift layer 22, the entire first base layer 23, and the lower portion of the source layer 25 via a portion 32 of the insulating body 30.

The semiconductor device 1 includes pluralities of the insulating body 30, the FP electrode 12, the gate electrode 13, the trench contact 15, the first base layer 23, the second base layer 24, and the source layer 25. The portion of the semiconductor part 20 positioned between adjacent insulating bodies 30, i.e., the upper portion of the drift layer 22, the first base layer 23, the second base layer 24, and the source layer 25, are divided by the adjacent insulating bodies 30 and extend in the Y-direction.

The drain electrode 11, the source electrode 14, and the trench contact 15 are made of electrically-conductive materials and are made of, for example, metals. For example, the drain electrode 11 and the source electrode 14 are made of aluminum (Al); and the trench contact 15 is made of tungsten (W). A barrier metal layer (not illustrated) may be provided at the lower surface of the source electrode 14 and the side surface and lower surface of the trench contact 15. The barrier metal layer is, for example, a layer in which a titanium layer (Ti) and a titanium nitride layer (TIN) are stacked. The FP electrode 12 and the gate electrode 13 are made of electrically-conductive materials and are made of, for example, polysilicon that includes an impurity. The insulating body 30 and the insulating film 36 are made of insulating materials and are made of, for example, silicon oxide ($SiO_2$).

Operations and effects of the semiconductor device according to the embodiment will now be described.

Figure 3:
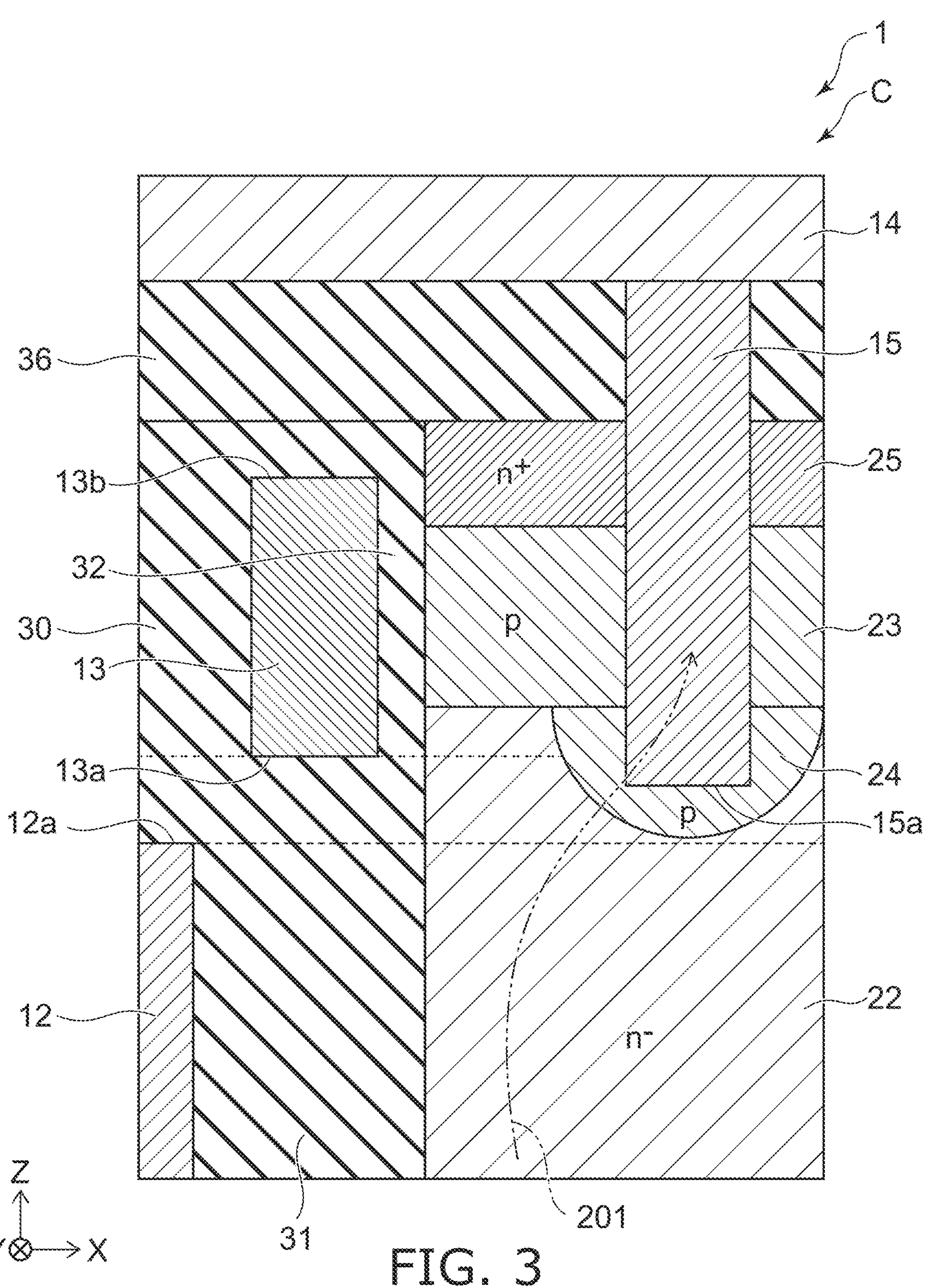
FIG. 3 is a cross-sectional view showing an operation of the semiconductor device according to the first embodiment.

FIG. 3 is a cross-sectional view showing an operation of the semiconductor device according to the embodiment.

FIG. 3 shows a region corresponding to region C of FIG. 2.

In the semiconductor device 1 as shown in FIG. 3, when an excessive voltage is applied between the drain electrode 11 and the source electrode 14 in the off-state and avalanche breakdown occurs in the semiconductor part 20, a hole current 201 flows from the drain electrode 11 toward the source electrode 14. In the semiconductor device 1, the second base layer 24 is located at a position separated from the insulating body 30; and the carrier concentration of the second base layer 24 is greater than the carrier concentration of the first base layer 23. Therefore, the hole current 201 that flows through the drift layer 22 flows into the second base layer 24 more easily than the first base layer 23. Accordingly, the greater part of the hole current 201 flows into the trench contact 15 from the drift layer 22 via the second base layer 24 and is discharged via the source electrode 14.

The flow of the hole current 201 into the first base layer 23 can be suppressed thereby. As a result, fluctuation of the potential of the first base layer 23 can be suppressed; and the parasitic n-p-n transistor made of the drift layer 22, the first base layer 23, and the source layer 25 can be prevented from turning on. Therefore, secondary breakdown due to a current flowing through the portion of the parasitic n-p-n transistor that turned on can be suppressed. Therefore, the reliability of the semiconductor device 1 is high.

Comparative Example

Figure 4:
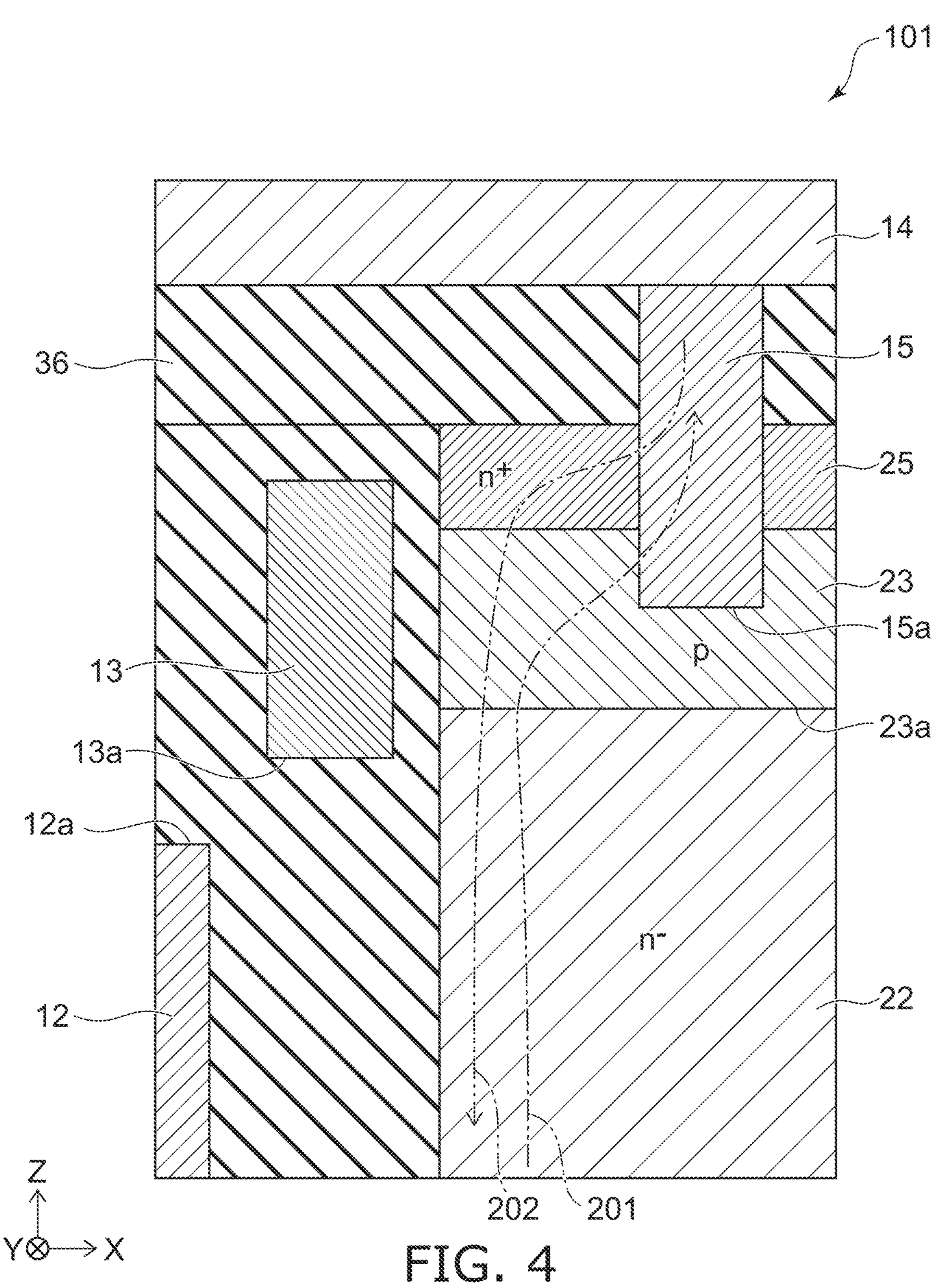
FIG. 4 is a cross-sectional view showing an operation of a semiconductor device according to a comparative example.

FIG. 4 is a cross-sectional view showing an operation of a semiconductor device according to the comparative example.

FIG. 4 shows a region corresponding to FIG. 3.

As shown in FIG. 4, the semiconductor device 101 according to the comparative example differs from the semiconductor device 1 according to the first embodiment in that the second base layer 24 is not provided, and the lower end 15*a* of the trench contact 15 is positioned higher than the lower surface 23*a* of the first base layer 23.

When avalanche breakdown occurs in the semiconductor device 101, the hole current 201 flows into the trench contact 15 from the drift layer 22 via the first base layer 23. As a result, the potential of the first base layer 23 increases, and the parasitic n-p-n transistor made of the drift layer 22, the first base layer 23, and the source layer 25 turns on. An electron current 202 therefore flows from the source layer 25 toward the drift layer 22 via the first base layer 23. As a result, secondary breakdown occurs, and the semiconductor device 101 may be damaged.

Second Embodiment

Figure 5:
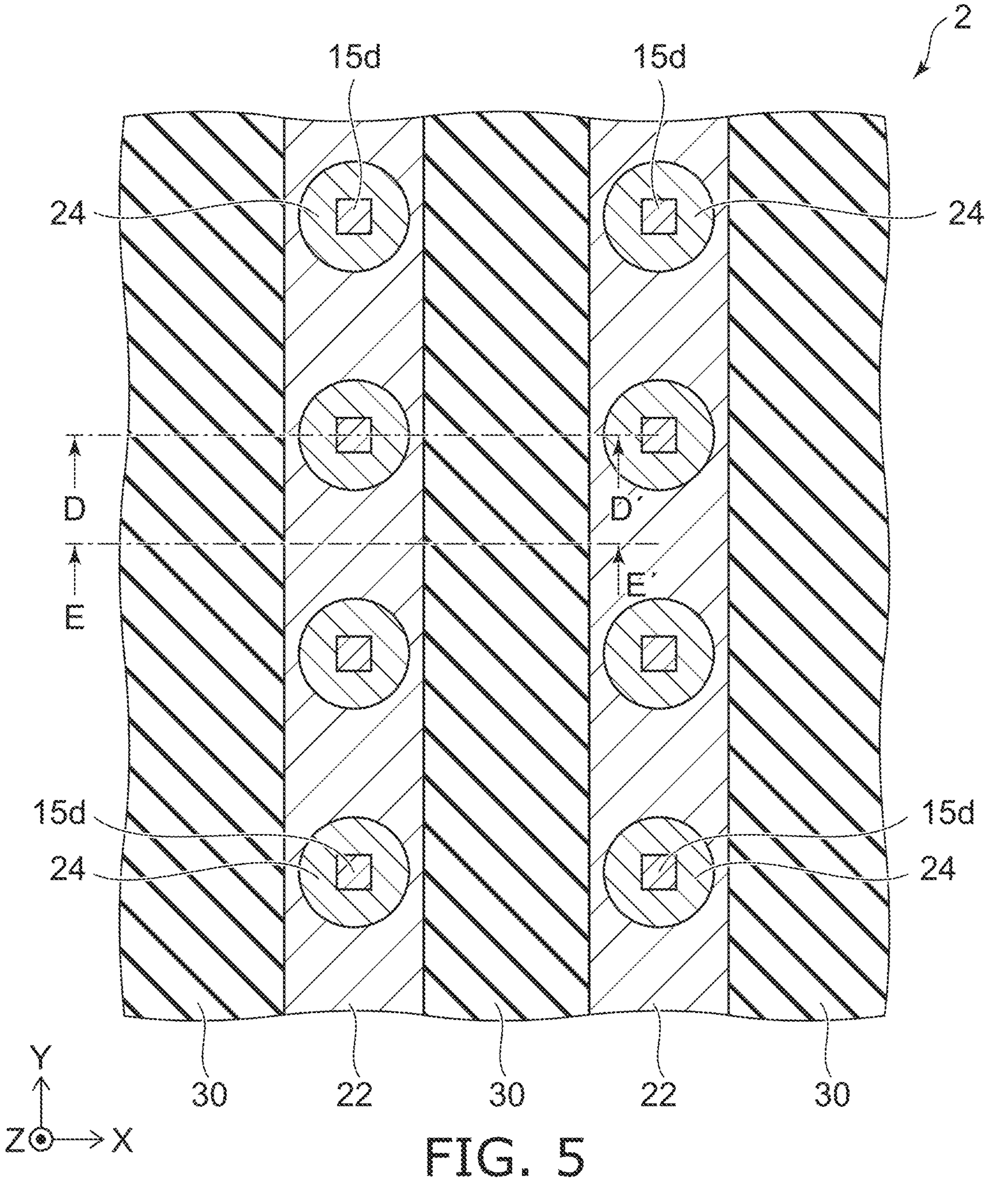
FIG. 5 is a cross-sectional view showing a semiconductor device according to a second embodiment.

FIG. 5 is a cross-sectional view showing a semiconductor device according to the embodiment.

Figure 6:
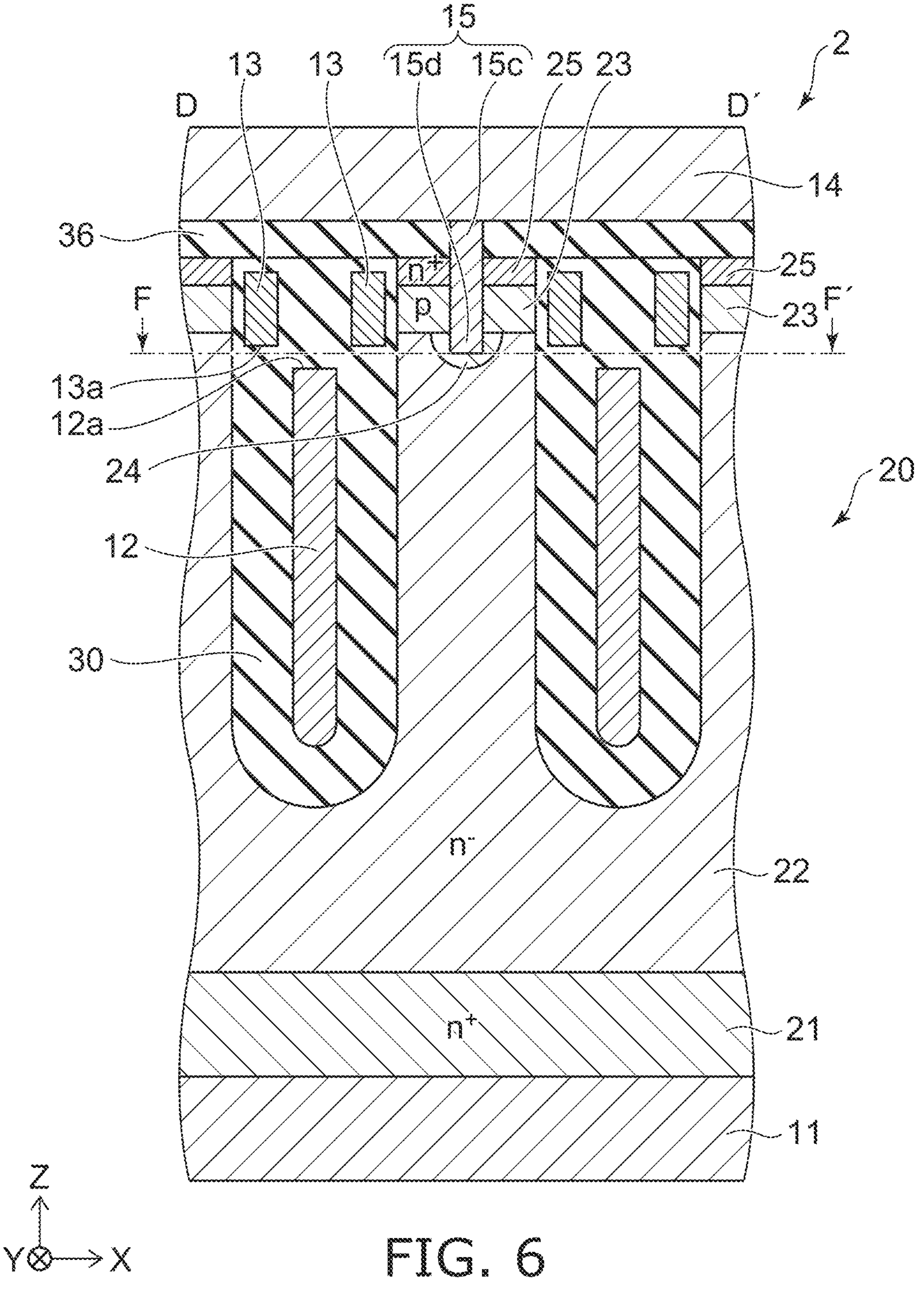
FIG. 6 is a cross-sectional view along line D-D' shown in FIG. 5.

FIG. 6 is a cross-sectional view along line D-D' shown in FIG. 5.

Figure 7:
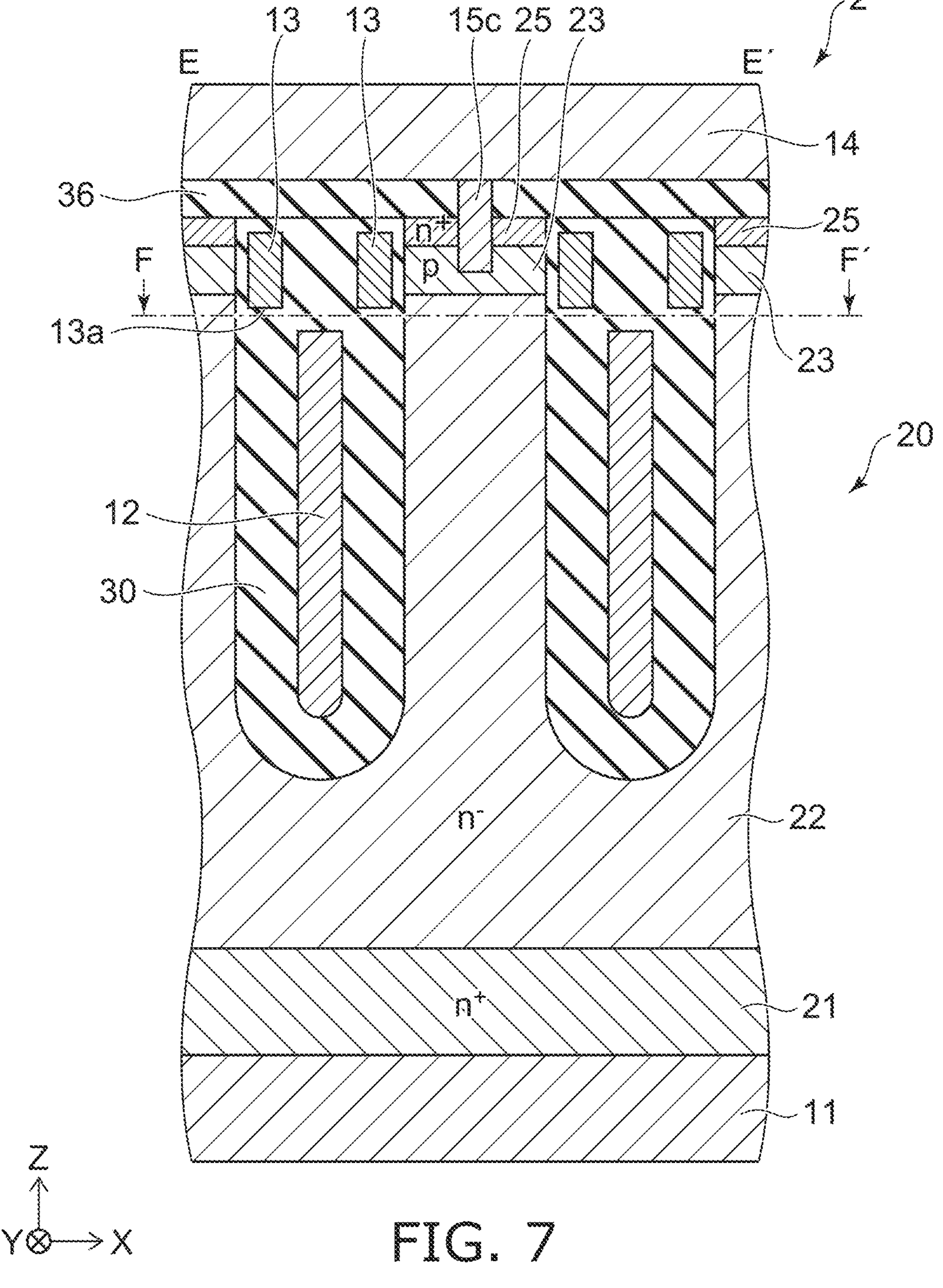
FIG. 7 is a cross-sectional view along line E-E' shown in FIG. 5.

FIG. 7 is a cross-sectional view along line E-E' shown in FIG. 5.

Figure 8:
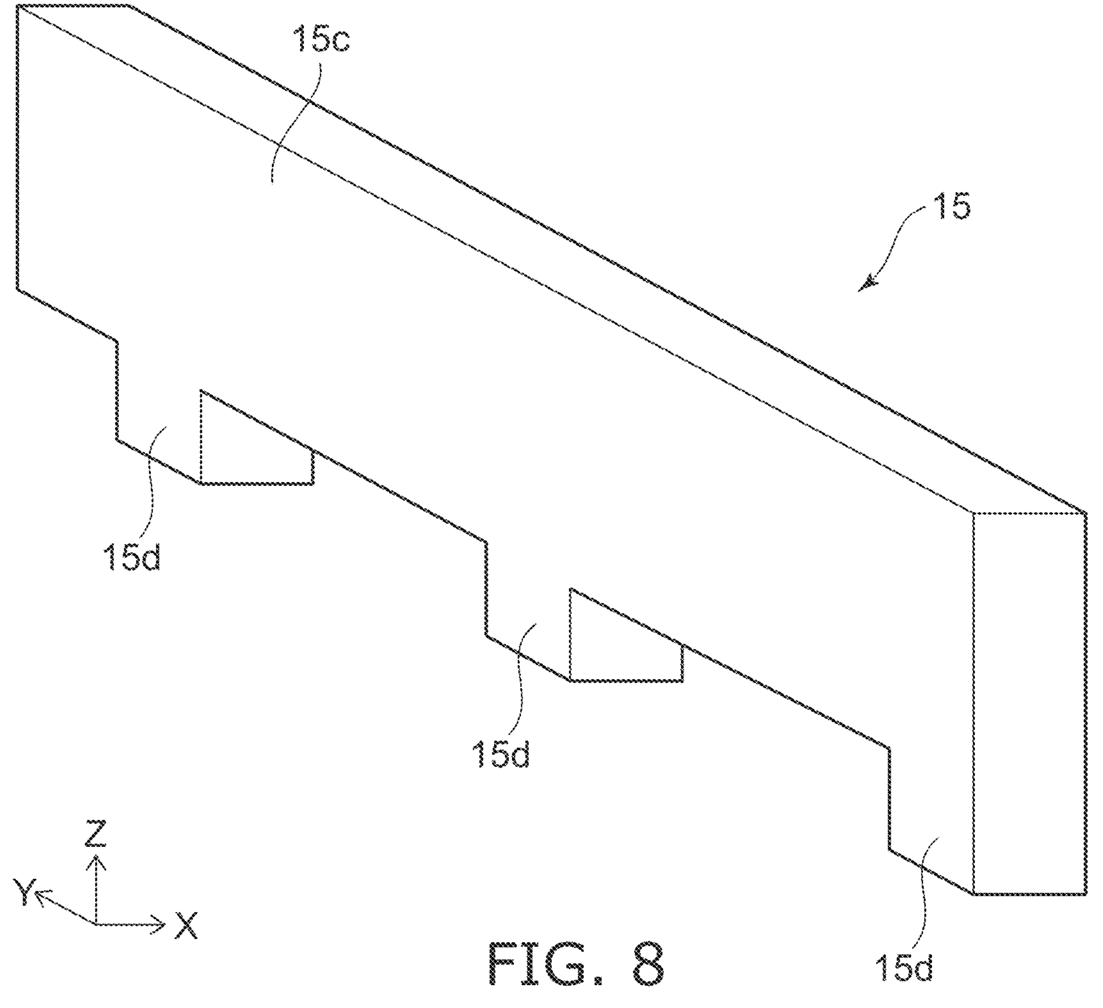
FIG. 8 is a perspective view showing a trench contact of the semiconductor device according to the second embodiment.

FIG. 8 is a perspective view showing a trench contact of the semiconductor device according to the embodiment.

FIG. 5 corresponds to the cross section along line F-F' shown in FIGS. 6 and 7.

As shown in FIGS. 5 to 8, the semiconductor device 2 according to the embodiment differs from the semiconductor device 1 according to the first embodiment in that the trench contact 15 includes a trunk part 15*c* that continuously extends in the Y-direction and multiple protrusions 15*d* that protrude downward from the trunk part 15*c*; and the multiple second base layers 24 are provided between the adjacent insulating bodies 30.

Each trench contact 15 includes one trunk part 15*c* and multiple protrusions 15*d*. The multiple protrusions 15*d* are arranged to be separated from each other along the Y-direction. The multiple second base layers 24 also are arranged to be separated from each other along the Y-direction. The second base layers 24 respectively cover the protrusions 15*d* of the trench contact 15. As shown in FIG. 7, the lower end of the trunk part 15*c* is positioned higher than the lower end 13*a* of the gate electrode 13. As shown in FIG. 6, the lower end of the protrusion 15*d* is positioned lower than the lower end 13*a* of the gate electrode 13 and higher than the upper end 12*a* of the FP electrode 12.

In the semiconductor device 2, the Y-direction positions of the protrusions 15*d* of the trench contacts 15 at the two X-direction sides of the insulating body 30 are the same. Therefore, the Y-direction positions of the second base layers 24 at the two X-direction sides of the insulating body 30 are the same.

Operations and effects of the embodiment will now be described.

In the semiconductor device 2, the $n^-$-type drift layer 22 and the p-type second base layer 24 are alternately arranged along the Y-direction in the upper portion of the semiconductor part 20 between the adjacent insulating bodies 30. A super junction structure is realized thereby. When an off-potential is input to the gate electrode 13 and the semiconductor device 2 is turned off, a depletion layer spreads not only in the Z-direction but also in the Y-direction with the interface between the drift layer 22 and the second base layer 24 as a starting point. The upper portion of the semiconductor part 20 between the adjacent insulating bodies 30 is depleted thereby. As a result, the breakdown voltage of the semiconductor device 2 can be increased. Otherwise, the configuration, operations, and effects according to the embodiment are similar to those of the first embodiment.

First Modification of Second Embodiment

Figure 9:
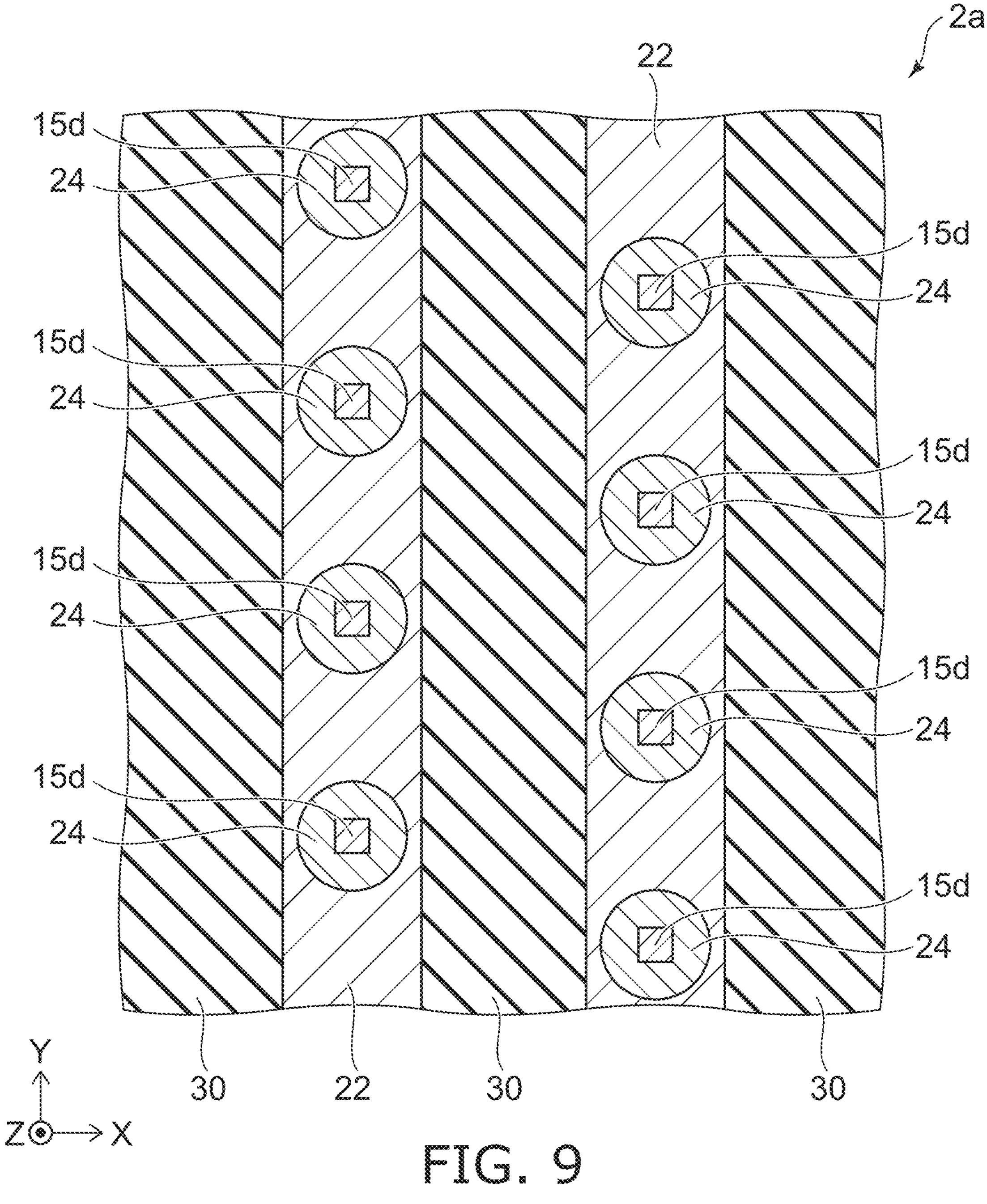
FIG. 9 is a cross-sectional view showing a semiconductor device according to a first modification of the first embodiment.

FIG. 9 is a cross-sectional view showing a semiconductor device according to the modification.

As shown in FIG. 9, the arrangement of the second base layer 24 and the protrusion 15*d* of the trench contact 15 in the semiconductor device 2*a* according to the modification is different from that of the semiconductor device 2 according to the second embodiment. Namely, the Y-direction positions of the protrusions 15*d* of the trench contacts 15 at the two X-direction sides of the insulating body 30 are different from each other. Therefore, the Y-direction positions of the second base layers 24 at the two X-direction sides of the insulating body 30 also are different from each other. In other words, the protrusion 15*d* and the second base layer 24 are arranged in a staggered configuration when viewed from above. Otherwise, the configuration, operations, and effects according to the modification are similar to those of the second embodiment.

Second Modification of Second Embodiment

Figure 10:
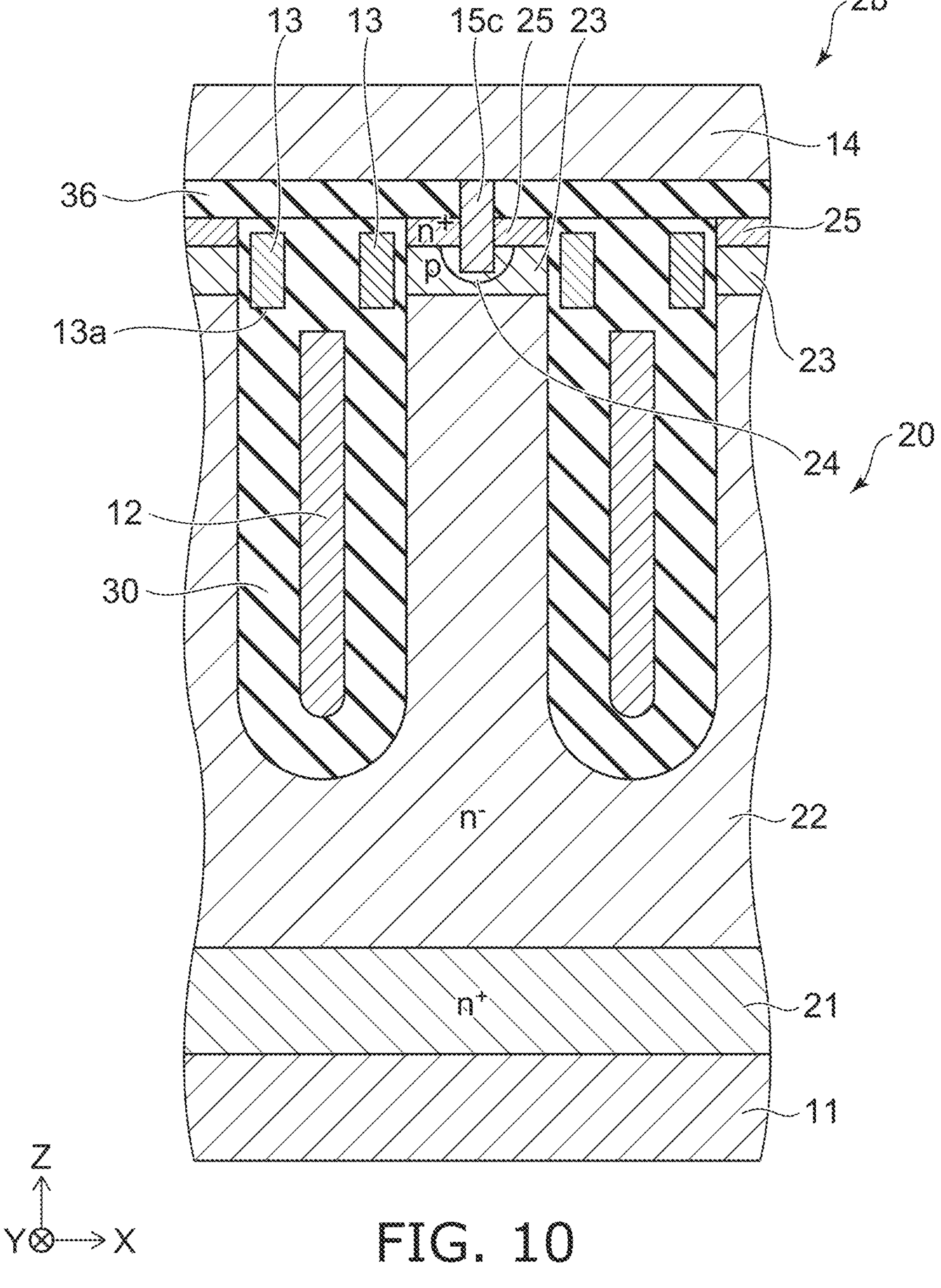
FIG. 10 is a cross-sectional view showing a semiconductor device according to a second modification of the second embodiment.

FIG. 10 is a cross-sectional view showing a semiconductor device according to the modification.

FIG. 10 corresponds to the cross section along line E-E' shown in FIG. 5.

According to the modification, the cross section corresponding to the cross section along line D-D' shown in FIG. 5 is similar to FIG. 6.

As shown in FIG. 10, the semiconductor device 2*b* according to the modification differs from the semiconductor device 2 according to the second embodiment in that the second base layer 24 covers not only the protrusion 15*d* of the trench contact 15 but also the lower end of the trunk part 15*c* of the trench contact 15. The shape of the trench contact 15 according to the modification is similar to that of the second embodiment (see FIG. 8). Accordingly, according to the modification, the second base layer 24 extends in the Y-direction while being reciprocally displaced in the Z-direction along the lower edge of the trench contact 15.

According to the modification, the portion of the second base layer 24 covering the lower end of the trunk part 15*c* of the trench contact 15 is located inside the first base layer 23. Similarly to the second embodiment, the portion of the second base layer 24 that covers the protrusion 15*d* of the trench contact 15 protrudes downward from the lower surface 23*a* of the first base layer 23. Otherwise, the configuration, operations, and effects according to the modification are similar to those of the second embodiment.

Test Example

A test example that shows effects of the first embodiment will now be described.

Figures 11A, 11B, 11C:
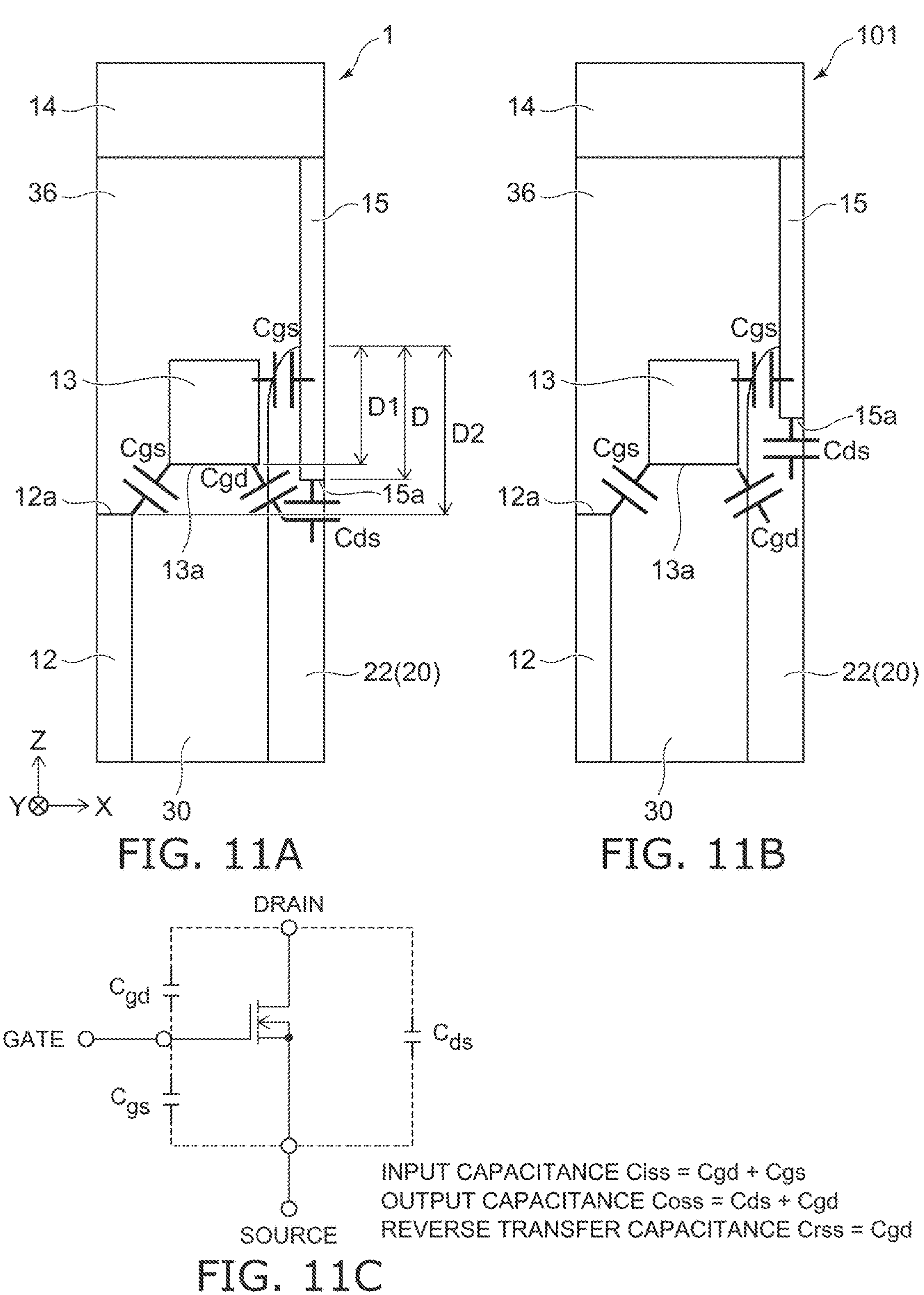
FIGS. 11A and 11B show a semiconductor device, distances, and variables assumed for a test example.
FIG. 11C shows capacitances.

FIGS. 11A and 11B show a semiconductor device, distances, and variables assumed for the test example; and FIG. 11C shows capacitances.

In the test example as shown in FIGS. 11A and 11B, the semiconductor device 1 according to the first embodiment described above and the semiconductor device 101 according to the comparative example were assumed.

In the Z-direction, the distance from the upper surface of the semiconductor part 20 to the lower end 13*a* of the gate electrode 13 was taken as a distance D1; the distance from the upper surface of the semiconductor part 20 to the lower end 15*a* of the trench contact 15 was taken as a distance D; and the distance from the upper surface of the semiconductor part 20 to the upper end 12*a* of the FP electrode 12 was taken as a distance D2.

The capacitance between the gate electrode 13 and the FP electrode 12 and the capacitance between the gate electrode 13 and the trench contact 15 were taken as a capacitance Cgs; the capacitance between the gate electrode 13 and the drift layer 22 was taken as a capacitance Cgd; and the capacitance between the drift layer 22 and the trench contact 15 was taken as a capacitance Cds. As shown in FIG. 11C, the sum of the capacitance Cgd and the capacitance Cgs was taken as an input capacitance Ciss; the sum of the capacitance Cds and the capacitance Cgd was taken as an output capacitance Coss; and the capacitance Cgd was taken as a reverse transfer capacitance Crss.

A simulation was performed to calculate the current density of the hole current when avalanche breakdown occurs, the breakdown voltage in the off-state, the output capacitance Coss, the reverse transfer capacitance Crss, and an output charge amount Qoss while changing the distance D from the upper surface of the semiconductor part 20 to the lower end 15*a* of the trench contact 15.

Current Density of Hole Current

Figures 12A, 12B:
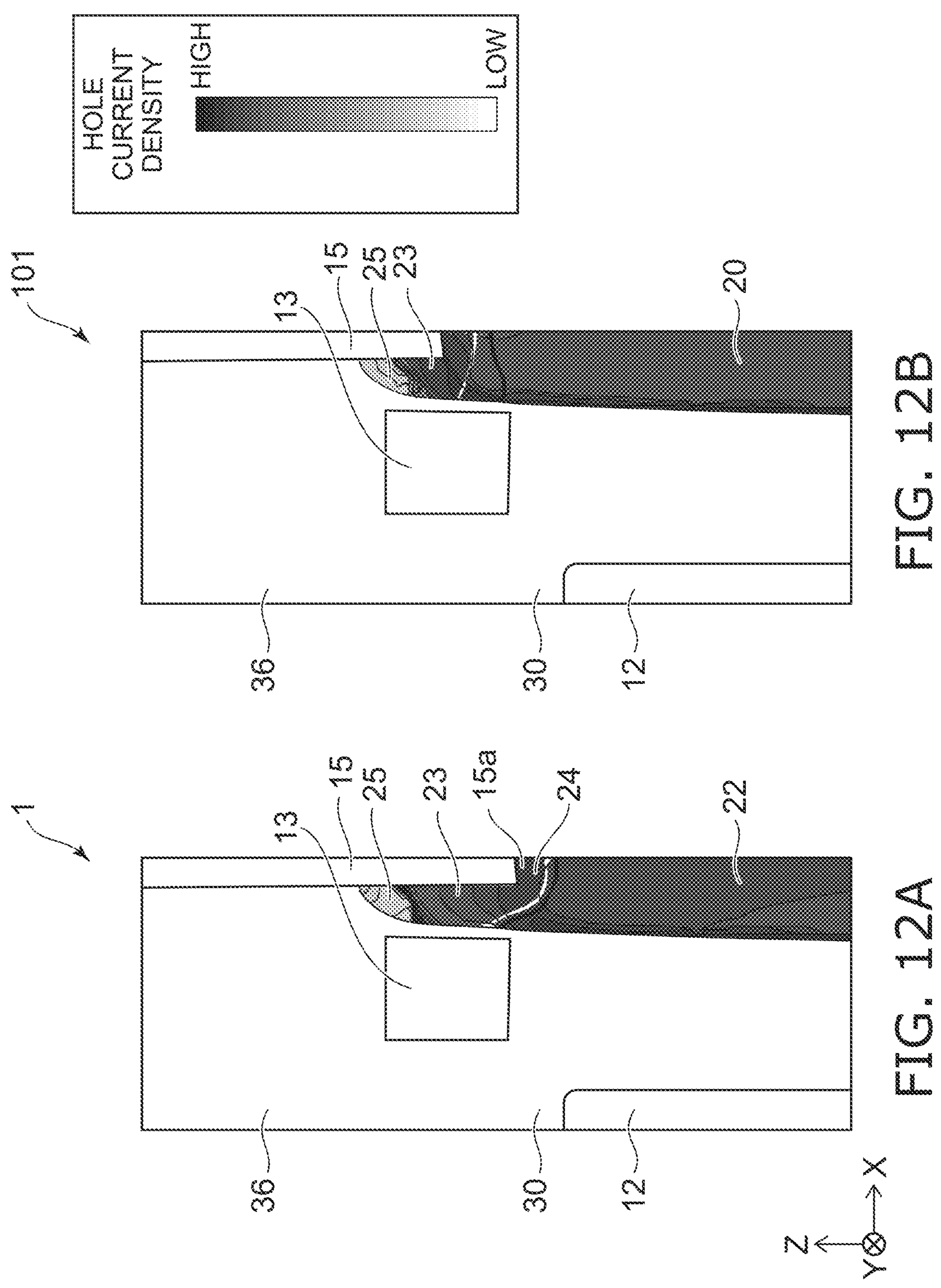
FIGS. 12A and 12B show a current density of a hole current when avalanche breakdown occurs.

FIGS. 12A and 12B show the current density of the hole current when avalanche breakdown occurs.

In the semiconductor device 1 according to the first embodiment as shown in FIG. 12A, the current density of the hole current was high at the lower end 15*a* vicinity of the trench contact 15, that is, at the second base layer 24 and the drift layer 22 at the periphery of the second base layer 24. In contrast, in the semiconductor device 101 according to the comparative example as shown in FIG. 12B, the current density of the hole current was high at the first base layer 23. Thus, in the semiconductor device 1, compared with the semiconductor device 101, secondary breakdown does not occur easily, even when avalanche breakdown occurs.

Breakdown Voltage

Figure 13:
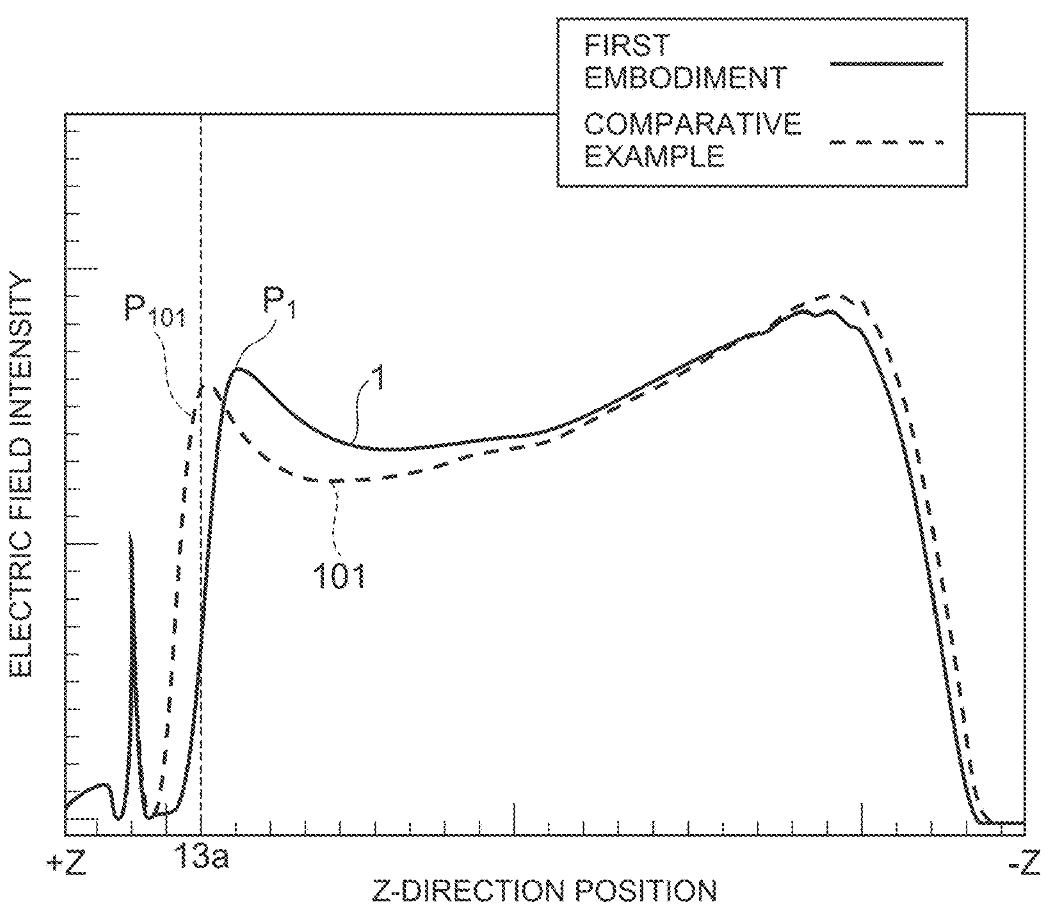
FIG. 13 shows an electric field intensity distribution in a semiconductor part, in which the horizontal axis is a Z-direction position, and the vertical axis is the electric field intensity.

FIG. 13 shows the electric field intensity distribution in the semiconductor part 20, in which the horizontal axis is the Z-direction position, and the vertical axis is the electric field intensity.

In FIG. 13, the left side of the horizontal axis is the upper side of the semiconductor device, i.e., the source electrode 14 side; and the right side of the horizontal axis is the lower side of the semiconductor device, i.e., the drain electrode 11 side.

Figure 14:
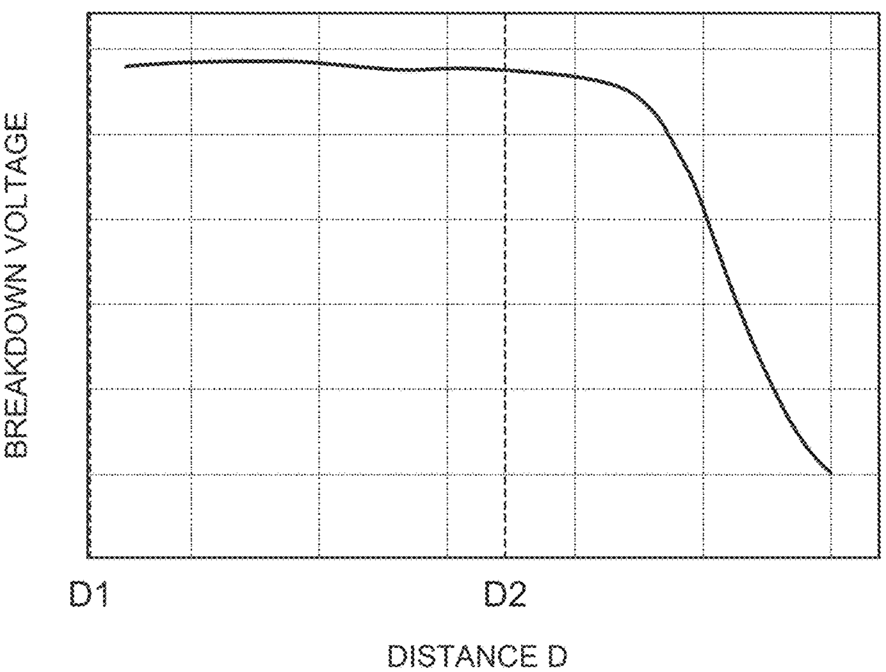
FIG. 14 is a graph showing effects of a position of a lower end of a trench contact on a breakdown voltage, in which the horizontal axis is a distance D, and the vertical axis is the breakdown voltage.

FIG. 14 is a graph showing the effects of the position of the lower end of the trench contact on the breakdown voltage, in which the horizontal axis is the distance D, and the vertical axis is the breakdown voltage.

As described above, the distance D is the distance from the upper surface of the semiconductor part 20 to the lower end 15*a* of the trench contact 15.

As shown in FIG. 13, the position of a peak $P_{101}$ of the electric field intensity of the semiconductor device 101 was at the lower end 13*a* vicinity of the gate electrode 13, whereas the position of a peak $P_1$ of the electric field intensity of the semiconductor device 1 was lower than the position of the peak $P_{101}$. Therefore, compared with the semiconductor device 101, the reliability of the semiconductor device 1 was high because the electric field concentration at the vicinity of the gate electrode 13 was relaxed. Also, the breakdown voltage of the semiconductor device 1, i.e., the integral of the electric field intensity, was about equal to the breakdown voltage of the semiconductor device 101. As shown in FIG. 14, the breakdown voltage was substantially constant for the distance D in the range between the distance D1 and the distance D2.

Output Capacitance Coss

Figure 15:
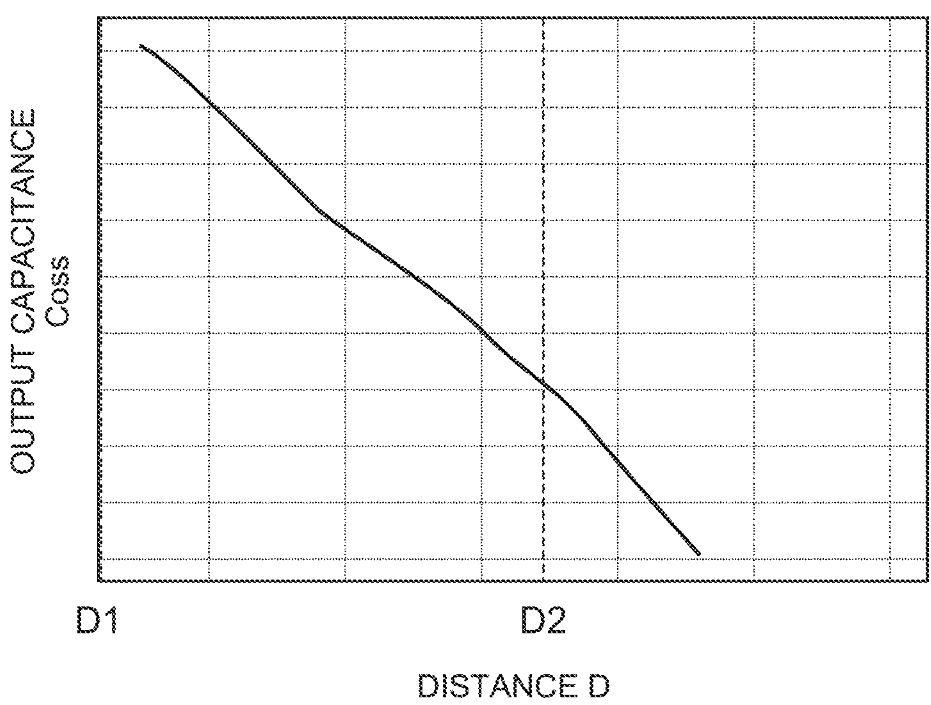
FIG. 15 is a graph showing effects of the position of the lower end of the trench contact on an output capacitance Coss, in which the horizontal axis is the distance D, and the vertical axis is the output capacitance Coss.

FIG. 15 is a graph showing effects of the position of the lower end of the trench contact on the output capacitance Coss, in which the horizontal axis is the distance D, and the vertical axis is the output capacitance Coss.

As shown in FIG. 15, the output capacitance Coss decreased as the distance D increased. It is considered that this is because the second base layer 24 also extended downward as the trench contact 15 extended downward, and as a result, the capacitance Cgd between the gate electrode 13 and the drift layer 22 decreased, and the capacitance Cds between the drift layer 22 and the trench contact 15 decreased.

Reverse Transfer Capacitance Crss

Figure 16:
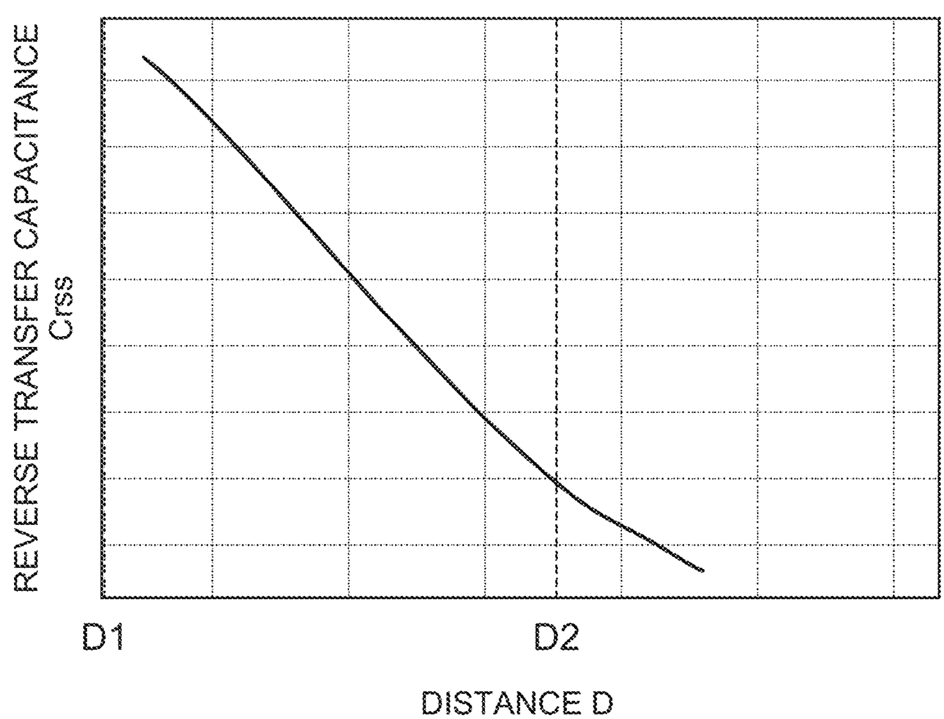
FIG. 16 is a graph showing effects of the position of the lower end of the trench contact on a reverse transfer capacitance Crss, in which the horizontal axis is the distance D, and the vertical axis is the reverse transfer capacitance Crss.

FIG. 16 is a graph showing effects of the position of the lower end of the trench contact on the reverse transfer capacitance Crss, in which the horizontal axis is the distance D, and the vertical axis is the reverse transfer capacitance Crss.

As shown in FIG. 16, the reverse transfer capacitance Crss decreased as the distance D increased. It is considered that this is because the second base layer 24 also extended downward as the trench contact 15 extended downward, and the capacitance Cgd between the gate electrode 13 and the drift layer 22 decreased.

Output Charge Amount Qoss

Figure 17:
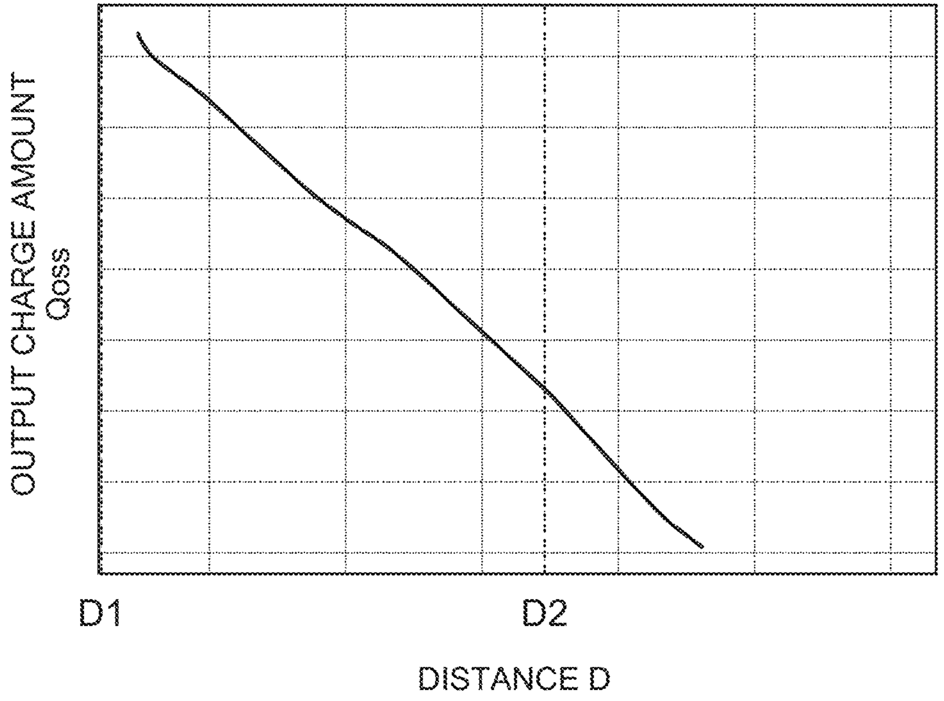
FIG. 17 is a graph showing effects of the position of the lower end of the trench contact on an output charge amount Qoss, in which the horizontal axis is the distance D, and the vertical axis is the output charge amount Qoss.

FIG. 17 is a graph showing effects of the position of the lower end of the trench contact on the output charge amount Qoss, in which the horizontal axis is the distance D, and the vertical axis is the output charge amount Qoss.

As shown in FIG. 17, the output charge amount Qoss decreased as the distance D increased. It is considered that this is because the output capacitance Coss decreased as the trench contact 15 extended downward.

Thus, the test example showed that in the semiconductor device 1 according to the first embodiment, compared with the semiconductor device 101 according to the comparative example, secondary breakdown did not easily occur when avalanche breakdown occurred, the breakdown voltage was equivalent, and the reliability was therefore high. It was also shown that in the semiconductor device 1, compared with the semiconductor device 101, high-speed operation is possible because the output capacitance, the reverse transfer capacitance, and the output charge amount are small.

According to the embodiments described above, a semiconductor device having high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Embodiments include the following aspects.

Note 1

A semiconductor device, comprising:

a first electrode;

a second electrode;

a first semiconductor layer located between the first electrode and the second electrode, the first semiconductor layer being of a first conductivity type;

a third electrode located in the first semiconductor layer, the third electrode facing the first semiconductor layer via a portion of an insulating body;

a second semiconductor layer located between the first semiconductor layer and the second electrode, the second semiconductor layer including a lower surface positioned at the first electrode side, the second semiconductor layer being electrically connected with the second electrode, the second semiconductor layer being of a second conductivity type;

a third semiconductor layer extending from the second semiconductor layer toward the first electrode side, a lower end of the third semiconductor layer at the first electrode side being positioned further toward the first electrode side than the lower surface of the second semiconductor layer and being separated from the insulating body, the third semiconductor layer being of the second conductivity type;

a fourth electrode facing the second semiconductor layer via an other portion of the insulating body; and a fourth semiconductor layer located between the second semiconductor layer and the second electrode and electrically connected with the second electrode, the fourth semiconductor layer being of the first conductivity type.

Note 2

The device according to note 1, wherein the third semiconductor layer is positioned further toward the second electrode side than an upper end of the third electrode positioned at the second electrode side.

Note 3

The device according to note 1 or 2, wherein a lower end of the third semiconductor layer is positioned further toward the first electrode side than a lower end of the fourth electrode positioned at the first electrode side.

Note 4

The device according to any one of notes 1-3, wherein a carrier concentration of the third semiconductor layer is greater than a carrier concentration of the second semiconductor layer.

Note 5

The device according to any one of notes 1-4, further comprising:

a fifth electrode extending in a direction from the second electrode toward the first electrode, the fifth electrode contacting the fourth and second semiconductor layers.

Note 6

The device according to note 5, wherein a lower end of the fifth electrode at the first electrode side is positioned further toward the first electrode side than the lower surface of the second semiconductor layer and contacts the third semiconductor layer.

Note 7

The device according to note 5 or 6, wherein the fifth electrode extends in a first direction in which the fourth electrode extends.

Note 8

The device according to note 7, wherein the third semiconductor layer extends in the first direction.

Note 9

The device according to note 5 or 6, wherein the fifth electrode includes:

a trunk part extending in the first direction in which the fourth electrode extends; and a plurality of protrusions protruding from the trunk part toward the first electrode side, and the plurality of protrusions is arranged along the first direction.

Note 10

The device according to note 9, wherein a plurality of the third semiconductor layers is provided, and the plurality of third semiconductor layers respectively covers the protrusions.

What is claimed is:

1. A semiconductor device, comprising:

a first electrode;

a second electrode;

a first semiconductor layer located between the first electrode and the second electrode, the first semiconductor layer being of a first conductivity type;

a third electrode located in the first semiconductor layer, the third electrode facing the first semiconductor layer via a portion of an insulating body;

a second semiconductor layer located between the first semiconductor layer and the second electrode, the second semiconductor layer including a lower surface positioned at the first electrode side, the second semiconductor layer being electrically connected with the second electrode, the second semiconductor layer being of a second conductivity type;

a third semiconductor layer extending from the second semiconductor layer toward the first electrode side, a lower end of the third semiconductor layer at the first electrode side being positioned further toward the first electrode side than the lower surface of the second semiconductor layer and being separated from the insulating body, the third semiconductor layer being of the second conductivity type, wherein the third semiconductor layer is positioned further toward the second electrode side than an upper end of the third electrode positioned at the second electrode side;

a fourth electrode facing the second semiconductor layer via an other portion of the insulating body; and a fourth semiconductor layer located between the second semiconductor layer and the second electrode and electrically connected with the second electrode, the fourth semiconductor layer being of the first conductivity type.

2. The device according to claim 1, wherein a lower end of the third semiconductor layer is positioned further toward the first electrode side than a lower end of the fourth electrode positioned at the first electrode side.

3. The device according to claim 1, wherein a carrier concentration of the third semiconductor layer is greater than a carrier concentration of the second semiconductor layer.

4. The device according to claim 1, further comprising:

a fifth electrode extending in a direction from the second electrode toward the first electrode, the fifth electrode contacting the fourth and second semiconductor layers.

5. The device according to claim 4, wherein a lower end of the fifth electrode at the first electrode side is positioned further toward the first electrode side than the lower surface of the second semiconductor layer and contacts the third semiconductor layer.

6. The device according to claim 4, wherein the fifth electrode extends in a first direction in which the fourth electrode extends.

7. The device according to claim 6, wherein the third semiconductor layer extends in the first direction.

8. The device according to claim 4, wherein the fifth electrode includes:

a trunk part extending in the first direction in which the fourth electrode extends; and a plurality of protrusions protruding from the trunk part toward the first electrode side, and the plurality of protrusions is arranged along the first direction.

9. The device according to claim 8, wherein a plurality of the third semiconductor layers is provided, and the plurality of third semiconductor layers respectively covers the protrusions.

* * * * *